United States Patent [19]

Dietz et al.

[11] Patent Number: 5,517,441
[45] Date of Patent: May 14, 1996

[54] CONTENT ADDRESSABLE MEMORY CIRCUITRY AND METHOD OF OPERATION

[75] Inventors: Carl D. Dietz, Kyle; Kathryn J. Hoover, Austin, both of Tex.

[73] Assignee: International Business Machines Corporation, Armonk, N.Y.

[21] Appl. No.: 355,864

[22] Filed: Dec. 14, 1994

[51] Int. Cl.[6] .................................................. G11C 15/00
[52] U.S. Cl. ........................................ 365/49; 365/189.07
[58] Field of Search ................................ 365/49, 189.07; 395/435

[56] References Cited

U.S. PATENT DOCUMENTS 4,823,313  4/1989  Kadota ........................................ 365/49

*Primary Examiner*—Joseph A. Popek
*Attorney, Agent, or Firm*—Michael A. Davis, Jr.

[57] ABSTRACT

Content addressable memory circuitry and a method of operation are provided. First information is stored. A logic state of a first match line is selectively modified in response to a comparison between the first information and second information. Also, third information is stored. A logic state of a second match line is selectively modified in response to a comparison between the third information and fourth information. A logic state of the second match line is selectively modified in response to the logic state of the first match line.

21 Claims, 9 Drawing Sheets

CONTENT ADDRESSABLE MEMORY CIRCUITRY AND METHOD OF OPERATION

CROSS-REFERENCES TO RELATED APPLICATIONS

This patent application is related to coassigned copending U.S. patent application Ser. No. 08/355,874, Attorney Docket No. AT9-94-074, entitled "Comparator Circuitry and Method of Operation", by Dietz et al., and to coassigned copending U.S. patent application Ser. No. 08/355,883, Attorney Docket No. AT9-94-224, entitled "Processing System and Method of Operation", by Dietz, which are filed concurrently herewith and are hereby fully incorporated by reference herein.

TECHNICAL FIELD

This patent application relates in general to electronic circuitry and in particular to content addressable memory circuitry and a method of operation.

BACKGROUND OF THE INVENTION

Various electronic circuitry applications use content addressable memory circuitry. More particularly, content addressable memory circuitry is used to store information for comparison against other information. Typical previous techniques tail to achieve faster comparisons where a portion of the other information is available for comparison before another portion of the other information.

Thus, a need has arisen for content addressable memory circuitry and a method of operation, in which faster comparisons are achieved where a portion of the other information is available for comparison before another portion of the other information.

SUMMARY OF THE INVENTION

In content addressable memory circuitry and a method of operation, first information is stored. A logic state of a first match line is selectively modified in response to a comparison between the first information and second information. Also, third information is stored. A logic state of a second match line is selectively modified in response to a comparison between the third information and fourth information. A logic state of the second match line is selectively modified in response to the logic state of the first match line.

It is a technical advantage of the present invention that faster comparisons are achieved where the second information is available for comparison before the fourth information.

BRIEF DESCRIPTION OF THE DRAWINGS

An illustrative embodiment of the present inventions and their advantages are better understood by referring to the following descriptions and accompanying drawings, in which.

DETAILED DESCRIPTION

An illustrative embodiment of the present inventions and their advantages are better understood by referring to FIGS. 1–9 of the drawings, like alphanumeric characters being used for like and corresponding parts of the accompanying drawings.

Figure 1:
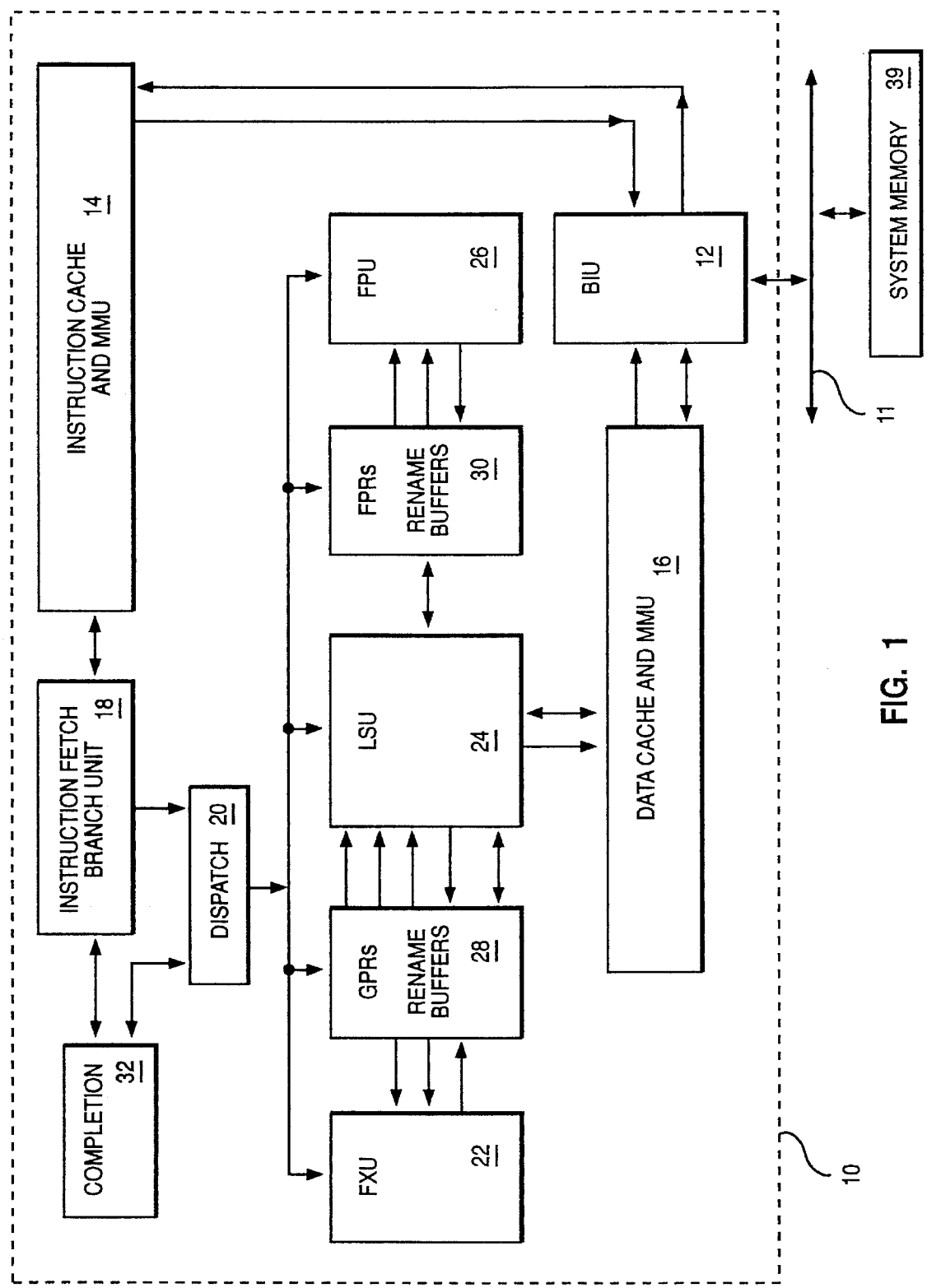
FIG. 1 is a block diagram of a system of the illustrative embodiment for processing information.

FIG. 1 is a block diagram of a processor 10 system of the illustrative embodiment for processing information. In the illustrative embodiment, processor 10 is a single integrated circuit superscalar microprocessor. Accordingly, as discussed further hereinbelow, processor 10 includes various units, registers, buffers, memories, and other sections, all of which are formed by integrated circuitry, and all of which are interconnected as shown in FIG. 1. Also, in the illustrative embodiment, processor 10 operates according to reduced instruction set computing ("RISC") techniques. As shown in FIG. 1, a system bus 11 is connected to a bus interface unit ("BIU") 12 of processor 10. BIU 12 controls the transfer of information between processor 10 and system bus 11.

BIU 12 is connected to a 4-kilobyte instruction cache/memory management unit ("MMU") 14 and to a 4-kilobyte data cache/MMU 16 of processor 10, as shown in FIG. 1. Instruction cache/MMU 14 outputs instructions to an instruction fetch/branch unit 18. In response to such instructions from instruction cache/MMU 14, instruction fetch/branch unit 18 selectively outputs instructions to other execution circuitry of processor 10.

In addition to instruction fetch/branch unit 18, in the illustrative embodiment the execution circuitry of processor 10 includes multiple execution units, namely a fixed point unit ("FXU") 22, a load/store unit ("LSU") 24 and a floating point unit ("FPU") 26. FXU 22 and LSU 24 input their source operand information from general purpose architectural registers ("GPRs")/rename buffers 28. FXU 22 and LSU 24 output results (destination operand information) of their operations for storage at selected rename buffers of GPRs/rename buffers 28.

FPU 26 inputs its source operand information from floating point architectural registers ("FPRs")/rename buffers 30. FPU 26 outputs results (destination operand information) of its operation for storage at selected rename buffers of FPRs/rename buffers 30.

In response to a Load instruction, LSU 24 inputs information from data cache/MMU 16 and copies such information to selected rename buffers of GPRs/rename buffers 28 and of FPRs/rename buffers 30. If such information is not stored in data cache/MMU 16, then data cache/MMU 16 inputs (through BIU 12 and system bus 11) such information from a system memory 39 connected to system bus 11. Moreover, data cache/MMU 16 is able to output (through BIU 12 and system bus 11) information from data cache/MMU 16 to system memory 39 connected to system bus 11. In response to a Store instruction, LSU 24 inputs information from a selected GPR (of GPRs/rename buffers 28) or FPR (of FPRs/rename buffers 30) and copies such information to data cache/MMU 16.

Instruction fetch/branch unit 18 inputs instructions and signals indicating a present state of processor 10. In response to such instructions and signals, instruction fetch/branch unit 18 computes suitable memory addresses which store a sequence of instructions for execution by processor 10. Instruction fetch/branch unit 18 inputs the indicated sequence of instructions from instruction cache/MMU 14. If one or more of the sequence of instructions is not stored in instruction cache/MMU 14, then instruction cache/MMU 14 inputs (through BIU 12 and system bus 11) such instructions from system memory 39 connected to system bus 11.

After inputting the instructions from instruction cache/MMU 14, instruction fetch/branch unit 18 outputs the instructions to a dispatch unit 20. After inputting the instructions from instruction fetch/branch unit 18, dispatch unit 20 selectively dispatches the instructions to selected ones of execution units 22, 24 and 26. Each execution unit executes one or more instructions of a particular class of instructions.

For example, FXU 22 executes a class of fixed point mathematical operations on source operands, such as addition, subtraction, ANDing, ORing, XORing, and fixed point multiplication and division. Floating point unit ("FPU") 26 executes floating point operations on source operands, such as floating point multiplication and division.

In connection with the processing of an instruction, as destination operand information is stored at a selected rename buffer of GPRs/rename buffers 28, such information is associated with a respective GPR of GPRs/rename buffers 28 as specified by the instruction for which the selected rename buffer is allocated. At a writeback stage of the instruction's processing, information stored at the selected rename buffer is copied to its associated GPR.

Likewise, as destination operand information is stored at a selected rename buffer of FPRs/rename buffers 30, such information is associated with a respective FPR of FPRs/rename buffers 30. At the writeback stage of the instruction's processing, information stored at the selected rename buffer is copied to its associated FPR.

Processor 10 achieves high performance by processing multiple instructions simultaneously at various ones of execution units 22, 24 and 26. Accordingly, each instruction is processed as a sequence of stages, each being executable in parallel with stages of other instructions. Such a technique is called "pipelining".

In a significant aspect of the illustrative embodiment, an instruction is normally processed as a sequence of stages, namely fetch, decode, dispatch, execute, completion, and writeback. A completion unit 32 inputs signals indicating a present state of processor 10. In response to such signals, completion unit 32 outputs suitable signals to dispatch unit 20 and to instruction fetch/branch unit 18 in order to process the completion stage of an instruction. Completion unit 32, dispatch unit 20, and instruction fetch/branch unit 18 operate in unison to process the instruction's completion stage by effecting various operations within processor 10, such as updating the status of various registers and flags within processor 10.

Figure 2:
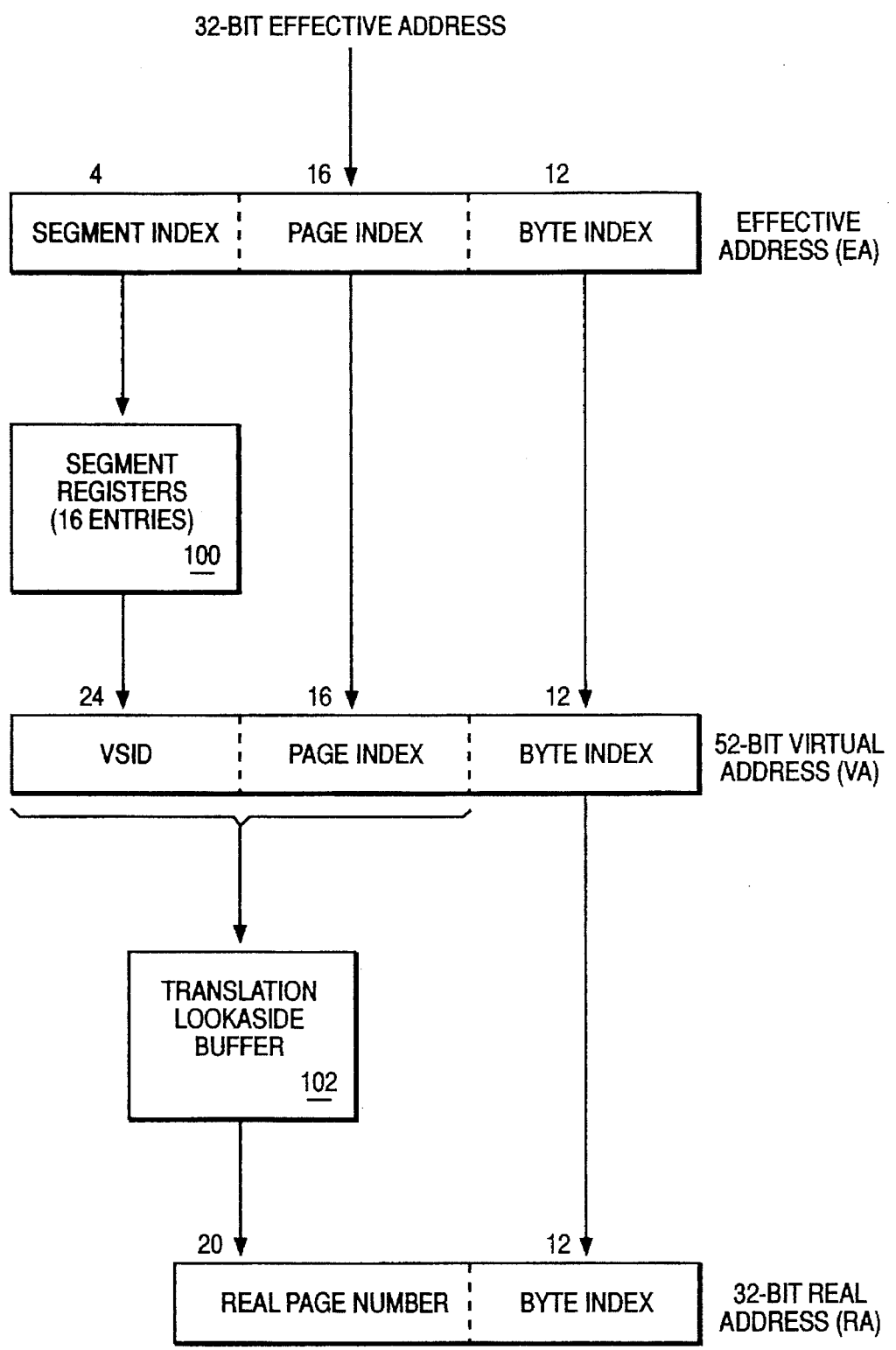
FIG. 2 is a conceptual illustration of a technique of the illustrative embodiment for translating a 32-bit effective address into its associated 32-bit real address.

FIG. 2 is a conceptual illustration of a technique of the illustrative embodiment for translating a 32-bit effective address ("EA") into its associated 32-bit real (or physical) address ("RA"). As shown in FIG. 2, processor 10 translates the EA into its associated RA according to a two-step translation technique. In the first step, processor 10 translates the EA into its associated virtual address ("VA"). In the second step, processor 10 translates the VA into its associated RA. More particularly, for instruction addresses, instruction cache/MMU 14 of processor 10 translates the instruction EA into its associated RA. For operand addresses, data cache/MMU 16 of processor 10 translates the operand EA into its associated RA.

The EA's bits $2^0$–$2^{11}$ form a Byte Index, the EA's bits $2^{12}$–$2^{27}$ form a Page Index, and the EA's bits $2^{28}$–$2^{31}$ form a Segment Index.

As part of the first step in which processor 10 translates the EA into its associated VA, processor 10 forms the VA's bits $2^0$–$2^{11}$ directly from the Byte Index, and processor 10 forms the VA's bits $2^{12}$–$2^{27}$ directly from the Page Index. Through a segment translation unit (i.e. through Segment Registers 100), processor 10 translates the Segment Index into its associated 24-bit Virtual Segment Identification ("VSID"). Then, processor 10 forms the VA's bits $2^{28}$–$2^{51}$ directly from the VSID.

More particularly, each of the sixteen Segment Registers 100 stores an associated VSID. As part of the first step of translating the EA into its associated VA, processor 10 selects one of the sixteen Segment Registers 100 in response to the 4-bit Segment Index. The selected Segment Register outputs its associated VSID, and processor 10 forms the VA's bits $2^{28}$–$2^{51}$ directly from this output VSID. Each of instruction cache/MMU 14 and data cache/MMU 16 includes a respective set of sixteen Segment Registers such as Segment Registers 100. In an alternative embodiment, processor 10 does not use Segment Registers 100 but instead translates the Segment Index into its associated 24-bit VSID using an alternative segment translation unit such as a segment lookaside buffer.

As part of the second step in which processor 10 translates the VA into its associated RA, processor 10 forms the RA's bits $2^0$–$2^{11}$ directly from the Byte Index. Through a translation lookaside buffer ("TLB") 102, processor 10 translates the 40-bit VSID/Page Index into an associated 20-bit Real Page Number ("RPN"). Then, processor 10 forms the RA's bits $2^{12}$–$2^{31}$ directly from the RPN. Each of instruction cache/MMU 14 and data cache/MMU 16 includes a respective TLB such as TLB 102.

In the illustrative embodiment, TLB 102 is a fully associative TLB, such that TLB 102 achieves a higher hit rate than an alternative set associative TLB. The range of valid VAs is logically organized into blocks called "pages". Each page has a size between 1 kilobyte ("Kb") and 4 kilobytes. TLB 102 stores multiple page table entries ("PTEs") each for translating a 40-bit VSID/Page Index into its associated RPN. A PTE is one type of address translation information. Accordingly, each PTE includes a respective VSID/Page Index, together with the VSID/Page Index's associated RPN. In the illustrative embodiment, two PTEs do not include the same VSID/Page Index, but two PTEs can include the same RPN.

In the illustrative embodiment, numerous PTEs are stored in page tables in system memory 39. TLB 102 is a relatively small cache which stores the most-recently accessed PTEs from system memory 39. TLB 102 compares its stored PTEs against the VA's 40-bit VSID/Page Index. If one of the PTEs in TLB 102 matches the VA's 40-bit VSID/Page Index, then TLB 102 outputs the matching PTE's associated RPN. If none of the PTEs in TLB 102 matches the VA's 40-bit VSID/Page Index, then processor 10 searches the page tables in system memory 39 for the matching PTE; in such a situation, after processor 10 locates the matching PTE in system memory 39, processor 10 stores the matching PTE into TLB 102; if TLB 102 is full, then processor 10 stores the matching PTE in place of a least recently accessed PTE previously stored in TLB 102.

As illustrated in FIG. 2, TLB 102 inputs the Page Index portion of the VA's 40-bit VSID/Page Index directly from the EA. By comparison, TLB 102 inputs the VSID portion of the VA's 40-bit VSID/Page Index from Segment Registers 100. Accordingly, since time is used for translating the EA's Segment Index into its associated VSID through Segment Registers 100, TLB 102 inputs the Page Index portion (directly from the EA) earlier than the VSID portion (from Segment Registers 100).

Notably, the Page Index portion (which is available earlier than the VSID portion) is a less significant portion of the 40-bit VSID/Page Index than is the VSID portion. Similarly, in an alternative embodiment, TLB 102 inputs the VA from a 32-bit adder. Due to the 32-bit adder's carry chain, TLB 102 inputs the VA's least significant bits earlier than the VA's most significant bits.

Figure 3:
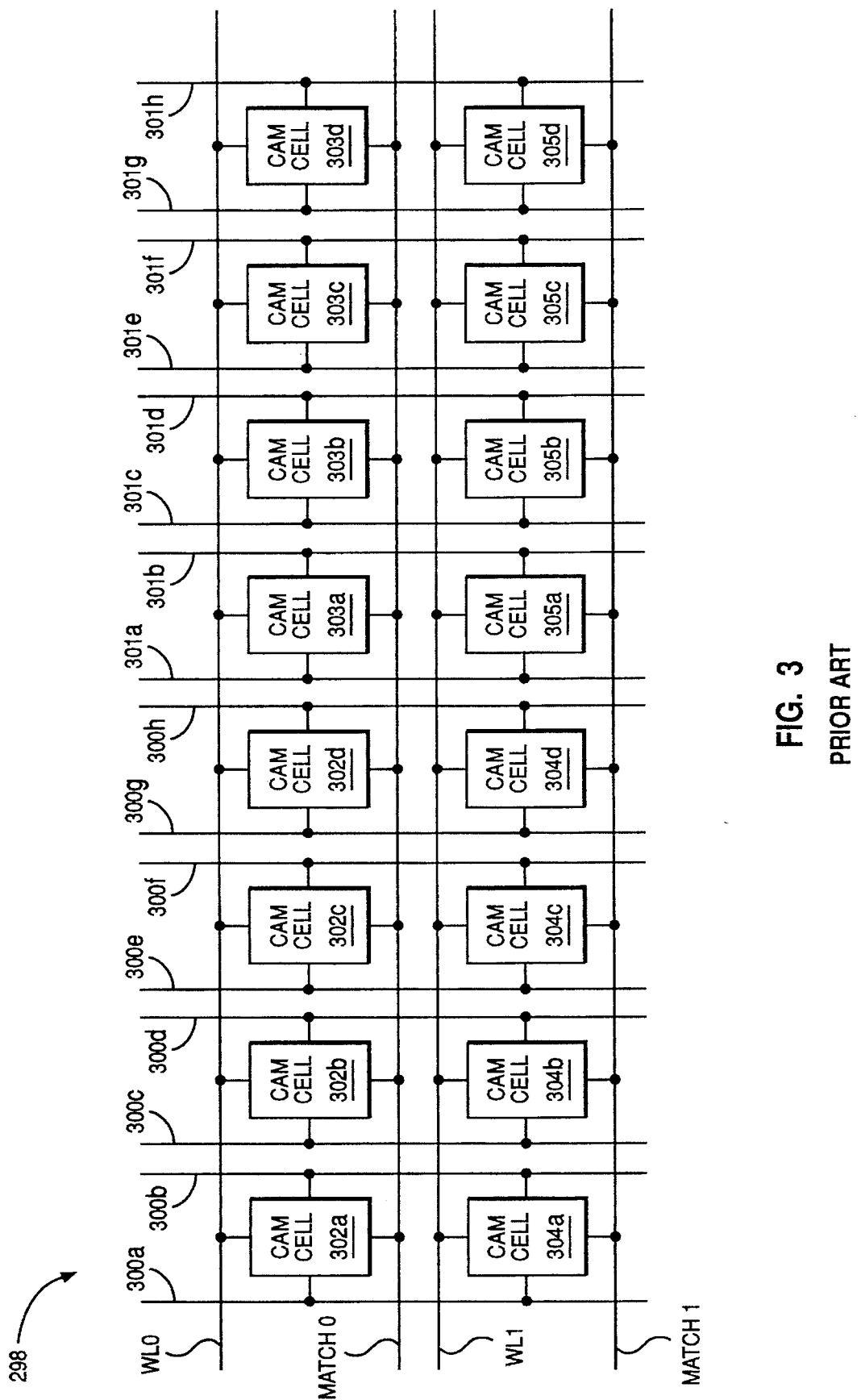
FIG. 3 is a schematic electrical circuit diagram of prior art content addressable memory ("CAM") circuitry.

FIG. 3 is a schematic electrical circuit diagram of prior art content addressable memory ("CAM") circuitry, indicated generally at 298. In a TLB, CAM circuitry 298 can be used for storing the most-recently accessed PTEs from a system memory and for comparing the stored PTEs against a portion of a VA. CAM circuitry 298 includes two rows of CAM cells. More particularly, the first row includes CAM cells 302-d, 303a-d, and additional CAM cells which are not shown in FIG. 3 for clarity. The second row includes CAM cells 304a-d, 305a-d, and additional CAM cells which are not shown in FIG. 3 for clarity.

In the first row, CAM circuitry 298 is able to store a first PTE, such that each of CAM cells 302a-d and 303a-d (and each of the additional CAM cells of the first row) stores a respective bit of the first PTE. Similarly, in the second row, CAM circuitry 298 is able to store a second PTE, such that each of CAM cells 304a-d and 305a-d (and each of the additional CAM cells of the second row) stores a respective bit of the second PTE. Likewise, CAM circuitry 298 can include additional rows for storing additional PTEs.

In one embodiment, only the non-RPN portion of the first PTE is stored in the first row of CAM circuitry 298, while the RPN portion of the first PTE is stored in a respective row of random access memory ("RAM") cells (not shown in FIG. 3) connected to a match line MATCH0 of the first row of CAM circuitry 298. Similarly, in such an embodiment, only the non-RPN portion of the second PTE is stored in the second row of CAM circuitry 298, while the RPN portion of the second PTE is stored in a respective row of RAM cells (not shown in FIG. 3) connected to a match line MATCH1 of the second row of CAM circuitry 298. Likewise, in such an embodiment, a respective row of RAM cells is connected to a respective match line of each additional row of CAM circuitry 298. Moreover, in such an embodiment, each particular row of CAM circuitry 298 includes a respective validity CAM cell for storing a valid bit; if a logic one state is stored in this validity CAM cell, then the particular row stores valid information.

As shown in FIG. 3, bit lines 300a–h and 301a–h are connected to the first and second rows of CAM circuitry 298. More particularly, the differential pair of bit lines 300a–b is connected to each of CAM cells 302a and 304a. Similarly, the differential pair of bit lines 300c–d is connected to each of CAM cells 302b and 304b. Also, the differential pair of bit lines 300e–f is connected to each of CAM cells 302c and 304c. Further, the differential pair of bit lines 300g–h is connected to each of CAM cells 302d and 304d.

Likewise, the differential pair of bit lines 301a–b is connected to each of CAM cells 303a and 305a. Moreover, the differential pair of bit lines 301c–d is connected to each of CAM cells 303b and 305b. In addition, the differential pair of bit lines 301e–f is connected to each of CAM cells 303c and 305c. Finally, the differential pair of bit lines 301g–h is connected to each of CAM cells 303d and 305d.

Information is read from a particular row of CAM circuitry 298 by selecting the particular row and reading differential logic signals representative of the information from the differential pairs of bit lines 300a–h and 301a–h. For example, the first row is selected by asserting word line WL0 to a logic one state and is deselected by clearing word line WL0 to a logic zero state. Likewise, the second row is selected by asserting a word line WL1 to a logic one state and is deselected by clearing word line WL1 to a logic zero state.

Information such as a PTE is stored into a particular row of CAM circuitry 298 by selecting the particular row and driving differential logic signals representative of the PTE through the differential pairs of bit lines 300a–h and 301a–h.

The stored PTEs are compared against a portion of a VA by deselecting all word lines (e.g. WL0 and WL1), precharging each differential pair of bit lines to a predetermined voltage state (e.g. a low-voltage state), precharging each of match lines MATCH0 and MATCH1 to a logic one state, and then driving differential logic signals representative of the one's complement of the portion of the VA through the differential pairs of bit lines. If the first row's stored PTE matches the portion of the VA, then the first row's connected match line MATCH0 remains charged to a logic one state. Similarly, if the second row's stored PTE matches the portion of the VA, then the second row's connected match line MATCH1 remains charged to a logic one state; otherwise, MATCH0 discharges to a logic zero state.

Figure 4A:
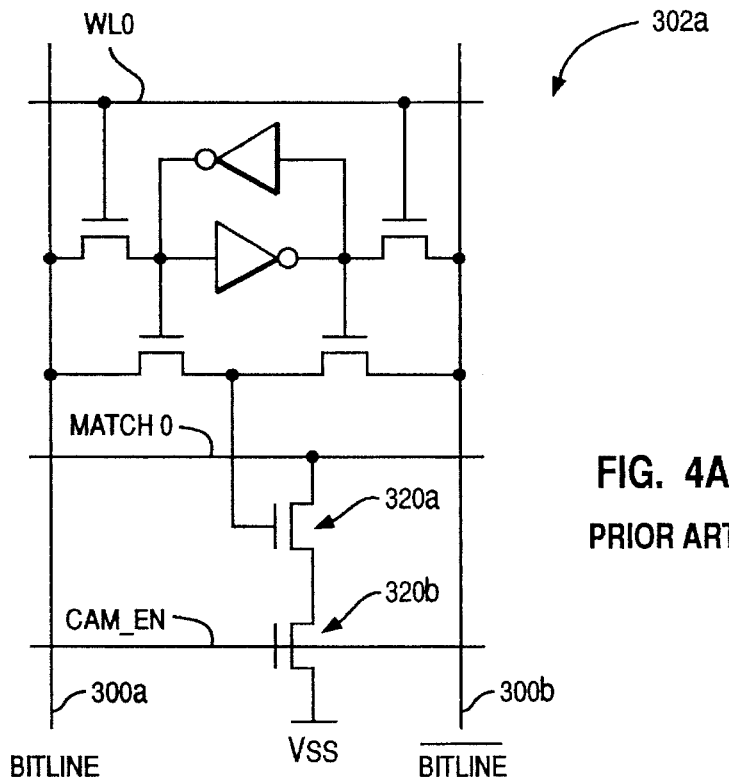
FIGS. 4a–4b are schematic electrical circuit diagrams of alternative versions of a representative CAM cell of the circuitry of FIG. 3.
Figure 4B:
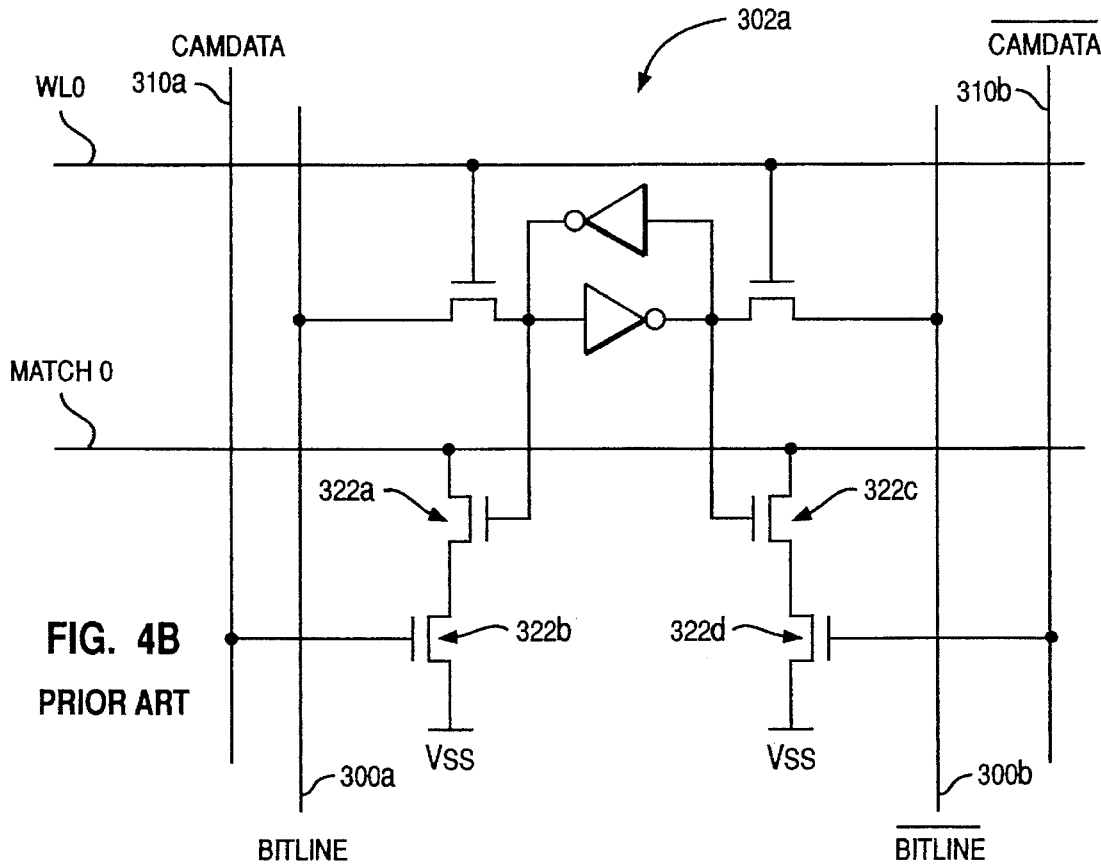
Figure 5:
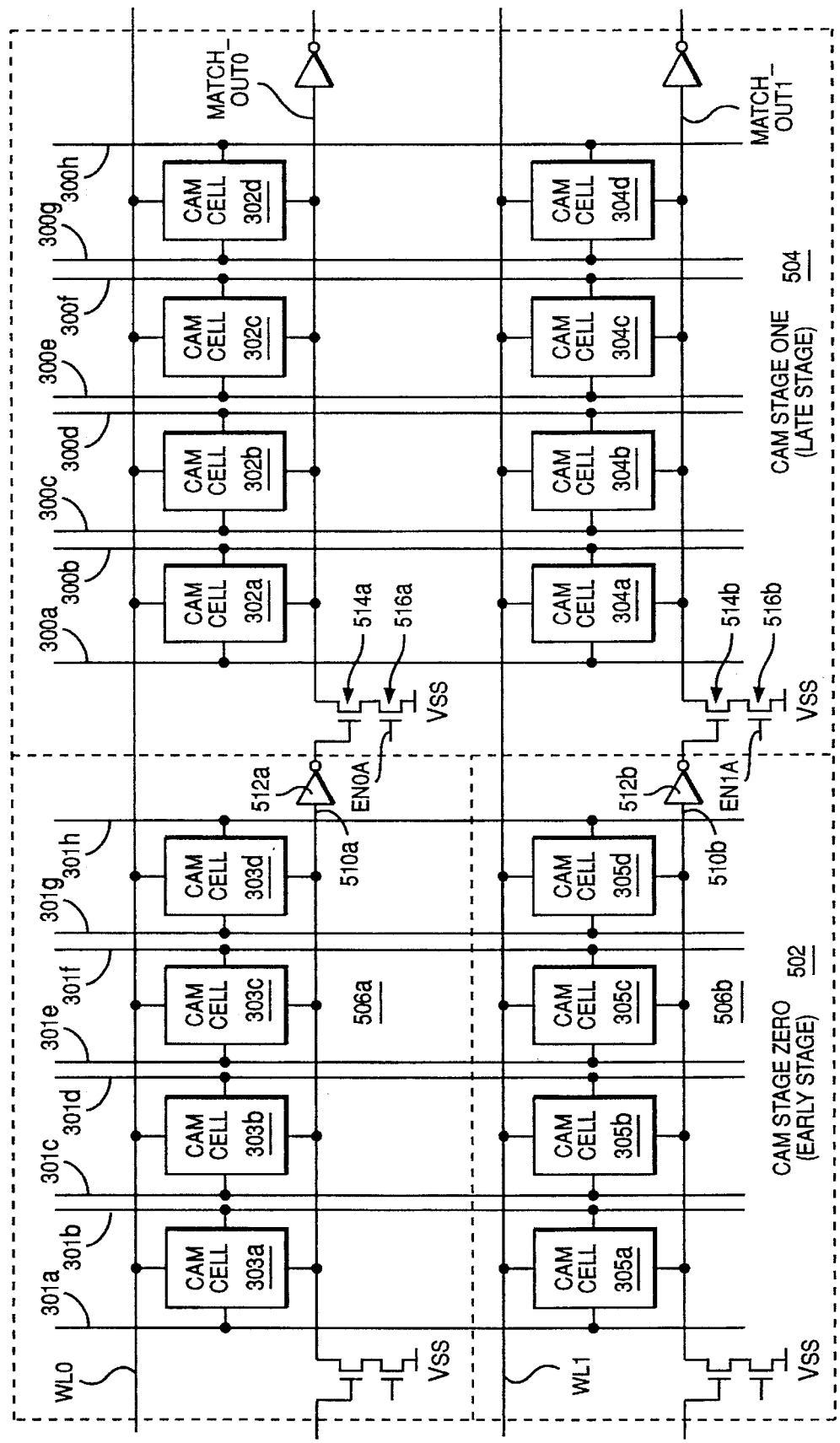
FIG. 5 is a schematic electrical circuit diagram of a first illustrative embodiment of cascadable CAM circuitry.
Figure 7:
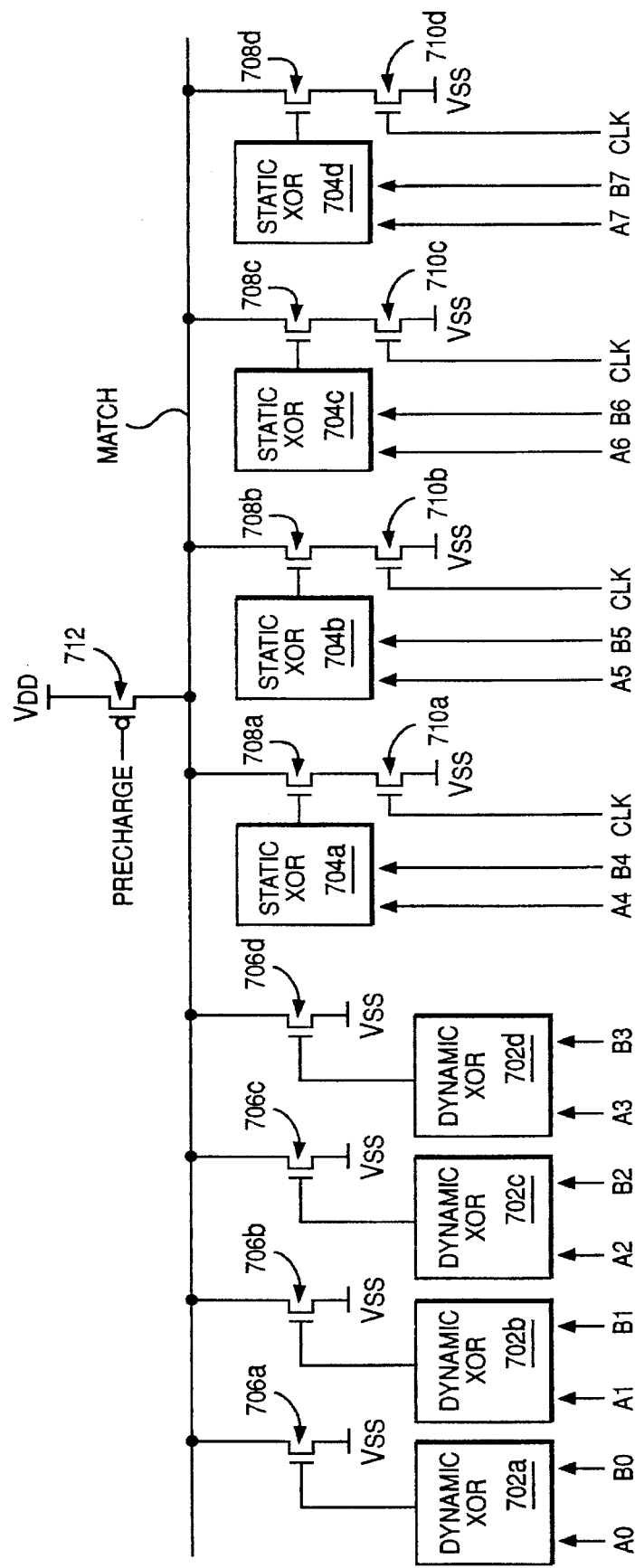
FIG. 7 is a schematic electrical circuit diagram of prior art dynamic comparator circuitry.
Figure 8:
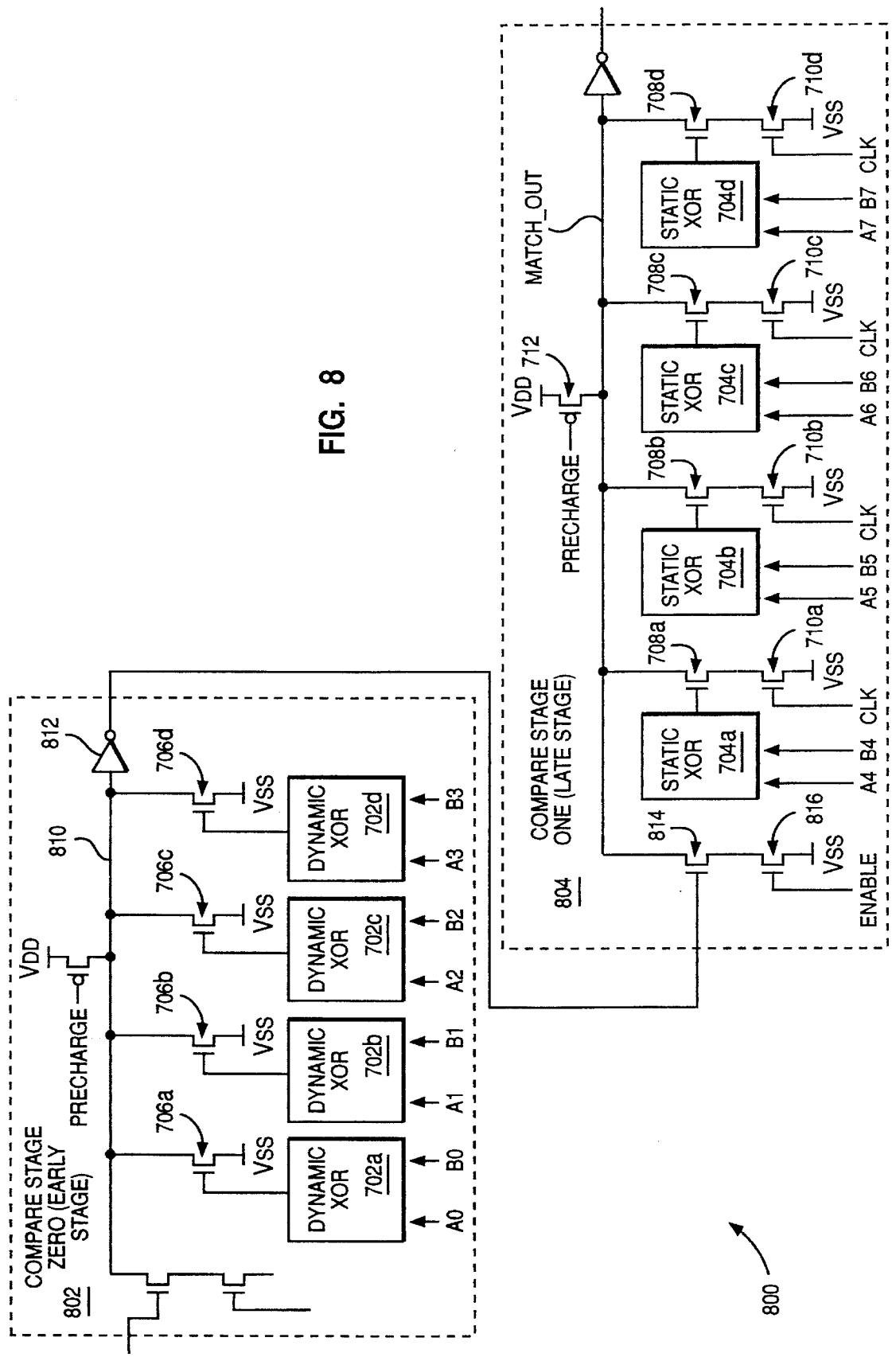
FIG. 8 is a schematic electrical circuit diagram of a first illustrative embodiment of cascadable dynamic comparator circuitry.
Figure 9:
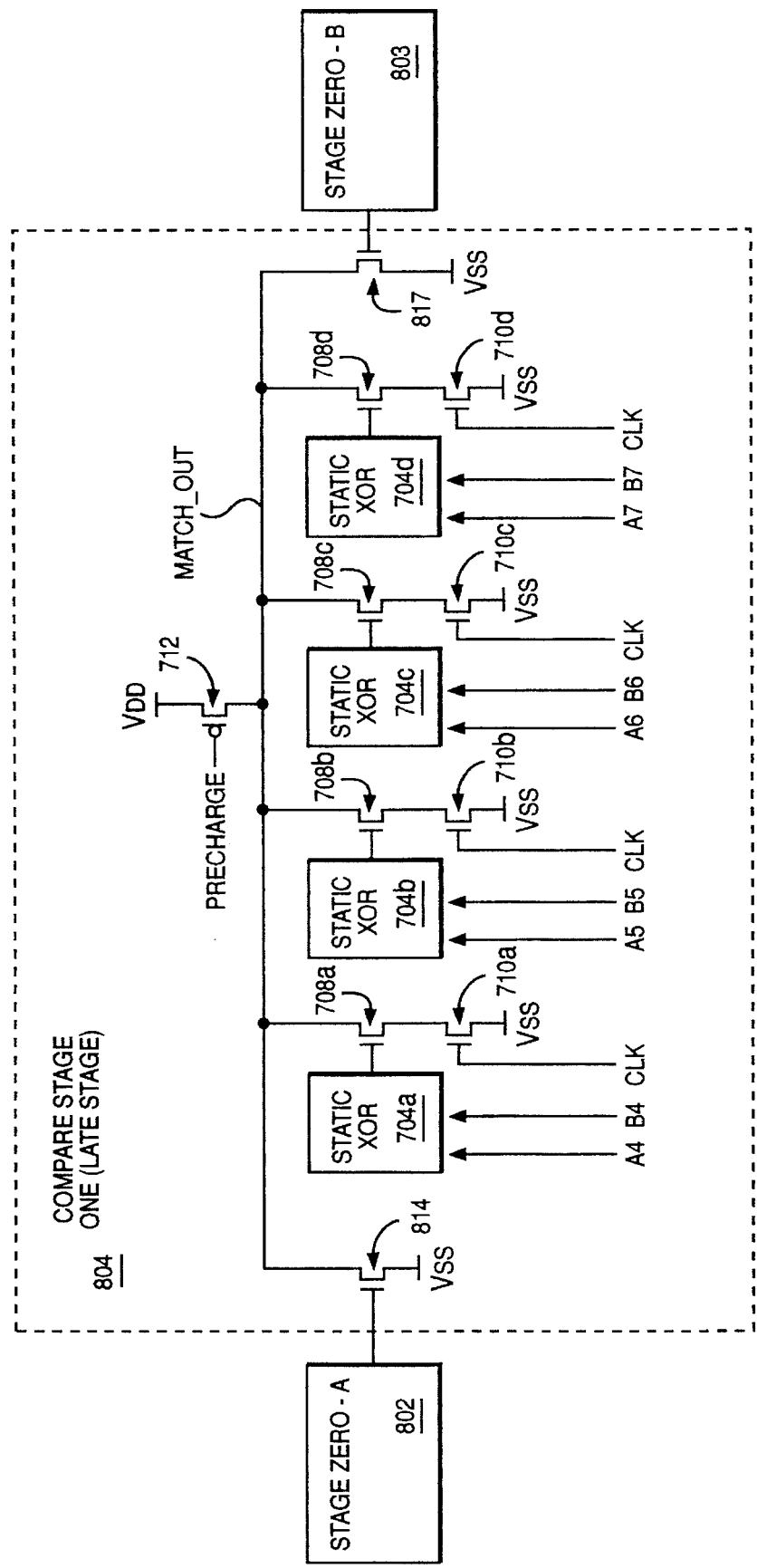
FIG. 9 is a schematic electrical circuit diagram of a second illustrative embodiment of cascadable dynamic comparator circuitry.

For clarity precharging circuitry is not shown in FIGS. 3–5. Analogous precharging circuitry is shown in FIGS. 7–9 discussed further hereinbelow.

In response to MATCH0 remaining charged to a logic one state, the TLB outputs the matching PTE's associated RPN from a respective row of RAM cells connected to MATCH0. In response to MATCH1 remaining charged to a logic one state, the TLB outputs the matching PTE's associated RPN from a respective row of RAM cells connected to MATCH1.

FIGS. 4a–b are schematic electrical circuit diagrams of alternative versions of representative CAM cell 302a of circuitry 298. CAM cell 302a is representative of the CAM cells of circuitry 298. In the examples of FIGS. 4a–b, a CAM cell includes a RAM cell together with dynamic comparator circuitry. The dynamic comparator circuitry is clocked, either by using a clocked enable signal (e.g. CAM_EN in FIG. 4a) or by clocking the delivery of information to bit lines (e.g. bit lines 310a–b in FIG. 4b).

Referring to FIG. 4a, a logic bit of information is read from CAM cell 302a by asserting word line WL0 to a logic one state and reading differential logic signals representative of the information from the differential pair of bit lines 300a and 300b. For example, if CAM cell 302a stores a logic one state, then asserting WL0 results in bit line 300*a* having a higher voltage level than bit line 300*b*, thereby representing the logic one state stored in CAM cell 302*a*. Similarly, if CAM cell 302*a* stores a logic zero state, then asserting WL0 results in bit line 300*a* having a lower voltage level than bit line 300*b*, thereby representing the logic zero state stored in CAM cell 302*a*.

A logic bit of information is stored into CAM cell 302*a* by asserting word line WL0 to a logic one state and driving differential logic signals representative of the information through the differential pair of bit lines 300*a* and 300*b*.

The stored logic bit of information is compared against a specified logic state by clearing word line WL0 to a logic zero state, precharging each of bit lines 300*a* and 300*b* to a low-voltage state, precharging match line MATCH0 to a logic one state, asserting enable line CAM_EN (not shown in FIG. 2 for clarity) to a logic one state, and then driving differential logic signals representative of the one's complement of the specified logic state through the differential pair of bit lines 300*a* and 300*b*.

For example, in order to compare the stored logic bit of information against a specified logic one state, differential logic signals representative of a logic zero state are driven through the differential pair of bit lines 300*a* and 300*b*, such that bit line 300*a* has a lower voltage level than bit line 300*b*. Similarly, in order to compare the stored logic bit of information against a specified logic zero state, differential logic signals representative of a logic one state are driven through the differential pair of bit lines 300*a* and 300*b*, such that bit line 300*a* has a higher voltage level than bit line 300*b*. If the stored logic bit of information matches the specified logic state, then match line MATCH0 remains charged to a logic one state; otherwise, MATCH0 discharges to a logic zero state.

Referring to FIG. 4*b*, an alternative version of CAM cell 302*a* is shown. In FIG. 4*b*, CAM cell 302*a* operates in the same manner as in FIG. 4*a*, except that:

(a) enable line CAM_EN is absent; and (b) bit lines 310*a* and 310*b* (not shown in FIG. 2 for clarity) are used for a "compare" operation in place of bit lines 300*a* and 300*b*, respectively.

In FIG. 4*b*, bit lines 300*a* and 300*b* are used for "read" and "store" operations in the same manner as in FIG. 4*a*. By using the differential pair of bit lines 310*a* and 310*b* for a "compare" operation in place of bit lines 300*a* and 300*b*, CAM cell 302*a* (FIG. 4*b*) is advantageously capable of performing the "compare" operation concurrently with performing a "read" or "store" operation. Moreover, in FIG. 4*b*, bit lines 300*a*–*b* and 310*a*–*b* undergo less loading than bit lines 300*a*–*b* in FIG. 4*a*.

Referring again to FIG. 3, according to one example, a TLB includes CAM circuitry 298 of FIG. 3 in connection with implementing the address translation technique of FIG. 2. In such an example, CAM cells 303*a*–*d* input bits $2^{24}$ through $2^{27}$ (part of the Page Index portion) of the VA's 40-bit VSID/Page Index directly from the EA. By comparison, CAM cells 302*a*–*d* input bits $2^{28}$ through $2^{31}$ (part of the VSID portion) of the VA's 40-bit VSID/Page Index from Segment Registers 100. As discussed further hereinabove in connection with FIG. 2, since time is used for translating the EA's Segment Index into its associated VSID through Segment Registers 100, TLB 102 inputs the Page Index portion (directly from the EA) earlier than the VSID portion (from Segment Registers 100). Notably, the Page Index portion (which is available earlier than the VSID portion) is a less significant portion of the 40-bit VSID/Page Index than is the VSID portion.

Each of CAM cells 302*a*–*d* and 303*a*–*d* contributes additional diffusion loading to their shared connected match line MATCH0, resulting from each CAM cell's respective pulldown transistor(s) (e.g. field effect transistors 320*a*–*b* in FIG. 4*a*, and field effect transistors 322*a*–*d* in FIG. 4*b*) connected to MATCH0. Accordingly, as more CAM cells are connected to match line MATCH0, the match line's diffusion loading and RC (resistance-capacitance) delay are increased.

FIG. 5 is a schematic electrical circuit diagram of a first illustrative embodiment of cascadable CAM circuitry, indicated generally at 500. In the illustrative embodiment, the respective TLB (such as TLB 102) in each of instruction cache/MMU 14 and data cache/MMU 16 includes CAM circuitry 500 which is improved over CAM circuitry 298 of FIG. 3. By including CAM circuitry 500 instead of CAM circuitry 298, the fully associative TLBs of the illustrative embodiment more quickly translate an EA into its associated RA.

In the example of FIG. 5, CAM circuitry 500 includes two identical cascadable stages, namely CAM Stage Zero (indicated by dashed enclosure 502) and CAM Stage One (indicated by dashed enclosure 504). More particularly, CAM Stage Zero 502 includes CAM cells 303*a*–*d* and 305*a*–*d*; these CAM cells are connected to bit lines 301*a*–*h* as shown in FIG. 5 and in the same manner as discussed further hereinabove in connection with FIG. 3. CAM Stage One 504 includes CAM cells 302*a*–*d* and 304*a*–*d*; these CAM cells are connected to bit lines 300*a*–*h* as shown in FIG. 5 and in the same manner as discussed further hereinabove in connection with FIG. 3.

In the example of FIG. 5, CAM Stage Zero 502 includes a Row-0 CAM Stage Zero-A 506*a* and a Row-1 CAM Stage Zero-A 506*b*. More particularly, Row-0 CAM Stage Zero-A 506*a* includes CAM cells 303*a*–*d*. By comparison, Row-1 CAM Stage Zero-A 506*b* includes CAM cells 305*a*–*d*.

Although only two cascadable stages (i.e. CAM Stage Zero 502 and CAM Stage One 504) are shown in FIG. 5, any number of additional stages can be included in circuitry 500. Each stage (except the last stage) is connected directly into a subsequent stage in the manner shown in FIG. 5, where CAM Stage Zero 502 is connected directly into subsequent stage CAM Stage One 504. In this manner, with the technique of the illustrative embodiment, large CAM circuitry is physically organized into a sequence of smaller cascadable stages, with each stage having its own respective match line (and its own respective circuitry for precharging such match line). Since each identical stage is cascadable, it advantageously is useful as a standard cell component within a circuit library.

For example, as shown in FIG. 5, Row-0 CAM Stage Zero-A 506*a* has a respective match line 510*a*, and Row-1 CAM Stage Zero-A 506*b* has a respective match line 510*b*. Advantageously, each of match line 510*a* and MATCH_OUT0 (FIG. 5) has less diffusion loading and less RC delay than MATCH0 (FIG. 3). This is because each of match line 510*a* and MATCH_OUT0 (FIG. 5) is shorter (and has fewer connected CAM cells) than MATCH0 (FIG. 3), and the diffusion loading of match line 510*a* is electrically isolated from the diffusion loading of MATCH_OUT0 by an inverter 512*a* and a pulldown n-channel field effect transistor 514*a*. Likewise, the diffusion loading of match line 510*b* is electrically isolated from the diffusion loading of MATCH_OUT1 by an inverter 512*b* and a pulldown n-channel field effect transistor 514*b*.

Accordingly, the diffusion loading and RC delay on MATCH_OUT0 and MATCH_OUT1 (FIG. 5) are reduced in comparison to the diffusion loading and RC delay on MATCH0 and MATCH1 (FIG. 3). The reduced diffusion loading and reduced RC delay enables each of CAM Stage Zero 502 and CAM Stage One 504 to achieve faster output edge rates than CAM circuitry 298, thereby speeding and improving the drive time of each of match lines 510a–b, MATCH._OUT0 and MATCH_OUT1 (FIG. 5) relative to MATCH0 and MATCH1 (FIG. 3).

Moreover, in CAM circuitry 500, each CAM cell has smaller devices than in CAM circuitry 298, thereby achieving smaller layout area within integrated circuitry. Each CAM cell's respective pulldown transistor(s) (e.g. field effect transistors 320a–b in FIG. 4a, and field effect transistors 322a–d in FIG. 4b) are smaller without sacrificing speed.

Individually, each of CAM Stage Zero 502 and CAM Stage One 504 has less diffusion loading and less RC delay and is therefore faster than circuitry 298. For a "compare" operation, if CAM circuitry 500 inputs a first portion of the to-be-compared information earlier than a second portion of the to-be-compared information, then CAM circuitry 500 performs the "compare" operation significantly faster than CAM circuitry 298. If CAM circuitry 500 inputs all of the to-be-compared information at substantially the same moment, then the significance of such improvement in speed is diminished.

Nevertheless, in the illustrative embodiment as discussed further hereinabove in connection with FIG. 2, since time is used for translating the EA's Segment Index into its associated VSID through Segment Registers 100, TLB 102 inputs the least significant Page Index portion (directly from the EA) earlier than the more significant VSID portion (from Segment Registers 100). In the present example, CAM cells 303a–d input bits $2^0$ through $2^3$ (part of the Page Index portion) of the VA's 40-bit VSID/Page Index directly from the EA. By comparison, CAM cells 302a–d input bits $2^{36}$ through $2^{39}$ (part of the VSID portion) of the VA's 40-bit-VSID/Page Index from Segment Registers 100. Thus, sequential CAM cells 303d and 302a input non-sequential bits $2^0$ and $2^{39}$, respectively, of the 40-bit VSID/Page Index.

Notably, CAM cells 302a–d are in CAM Stage One 504 rather than in CAM Stage Zero 502. Likewise, CAM cells 303a–d are in CAM Stage Zero 502 rather than in CAM Stage One 504. Accordingly, in terms of the bit significance order within the VA's 40-bit VSID/Page Index, the set of bits $2^{36}$ through $2^{39}$ are input by CAM circuitry 500 out of order relative to the set of bits $2^0$ through $2^3$.

However, in terms of the time order in which TLB 102 inputs the VA's 40-bit VSID/Page Index, the set of bits $2^{36}$ through $2^{39}$ are input by CAM circuitry 500 in order relative to the set of bits $2^0$ through $2^3$. This is because the set of bits $2^0$ through $2^3$ (part of the less significant Page Index portion input by CAM circuitry 500 directly from the EA) are input by CAM circuitry 500 earlier than the set of bits $2^{36}$ through $2^{39}$ (part of the more significant VSID portion input by CAM circuitry 500 from Segment Registers 100).

Accordingly, by CAM cells 303a–d inputting bits $2^0$ through $2^3$, and by CAM cells 302a–d inputting bits $2^{36}$ through $2^{39}$, CAM Stage Zero 502 is the early non-critical stage, and CAM Stage One 504 is the late critical stage. Thus, according to the cascadable CAM-based TLB technique of the illustrative embodiment, the early non-critical stage is more electrically isolated from the late critical stage when compared to conventional techniques.

Since information arrives at the early non-critical stage before the late critical stage, the isolation of diffusion loading and the smaller RC delay of CAM circuitry 500 allows the late critical CAM Stage One 504 (FIG. 5) to have a significantly faster response time than CAM circuitry 298 (FIG. 3). This response time is measured from the arrival of information through bit lines 300a–h until validity of the signal on the match line; the match line is MATCH_OUT0 for CAM Stage One 504 and is MATCH0 for CAM circuitry 298.

With the improved technique of FIG. 5, it is estimated that the match line (MATCH_OUT0) loading of the critical stage (CAM Stage One 504) is reduced by approximately 41% relative to the conventional technique of FIG. 3. Accordingly, in CAM Stage One 504 of the illustrative embodiment, each CAM cell's (302a–d) respective pulldown transistor(s) (e.g. field effect transistors 320a–b in FIG. 4a, and field effect transistors 322a–d in FIG. 4b) operate substantially faster than in FIG. 3. Alternatively, if silicon layout area is a more critical factor than speed, each CAM cell's respective pulldown transistor(s) can be advantageously 41% smaller than in FIG. 3.

Moreover, since the gate loading of each CAM cell's respective pulldown transistor(s) affects bit lines 300a–h, smaller pulldown transistor(s) advantageously result in less loading on bit lines 300a–h, thereby further increasing speed of CAM circuitry 500 (FIG. 5) relative to CAM circuitry 298 (FIG. 3). Further, it is estimated that the match line (510a) loading of the non-critical stage (CAM Stage Zero 502) is reduced by approximately 58% relative to the conventional technique of FIG. 3. All this is at least partly attributable to the tact that, in the illustrative embodiment of FIG. 5, the single common match line MATCH0 (FIG. 3) is replaced by multiple match lines 510a and MATCH_OUT0 (FIG. 5) each having less diffusion loading and RC delay than MATCH0.

Accordingly, the cascadable CAM-based TLB of the illustrative embodiment is both faster and smaller than a conventional CAM-based TLB. If a portion of the TLB compare data arrives earlier than another portion of the TLB compare data, the technique of the illustrative embodiment is significantly faster than a conventional CAM-based TLB technique.

Advantageously, the cascadable CAM-based TLB technique of the illustrative embodiment can be implemented with either type of CAM cell shown in FIGS. 4a–b. Moreover, CAM circuitry 500 can include more than one type of CAM cell. In one example embodiment, each of CAM cells 303a–d and 305a–d in CAM Stage Zero 502 is designed as shown in FIG. 4a., and each of CAM cells 302a–d and 304a–d is designed as shown in FIG. 4b. In such an example embodiment, each CAM cell in CAM Stage Zero 502 is selectively enabled in response to a signal on CAM_EN (FIG. 4a).

A source of an n-channel field effect transistor 516a is connected to a voltage reference node Vss. A drain of transistor 516a is connected to a source of an n-channel field effect transistor 514a. A drain of transistor 514a is connected to MATCH_OUT0.

Referring to FIG. 5, in operation, transistor 516a (in Row-0 of CAM Stage One 504) operates as an "enable" device for Row-0 CAM Stage Zero-A 506a. Likewise, a transistor 516b (in Row 2 of CAM Stage One 504) operates as an "enable" device for Row-1 CAM Stage Zero-A 506b (in response to a logic state of EN1A). If EN0A (connected to the gate of transistor 516a) is a logic one state, then transistor 516a is turned on; otherwise, transistor 516a is turned off. If transistor 516a is turned off, then preceding CAM Stage Zero 502 is "disabled", such that match line MATCH_OUT0 is controlled solely by CAM Stage One 504 without regard to CAM Stage Zero 502 or to the state of match line 510a. In that situation, any of CAM cells 302a–d is able to discharge match line MATCH_OUT0.

By comparison, if transistor 516a is turned on, then preceding CAM Stage Zero 502 is "enabled", such that match line MATCH_OUT0 is controlled by CAM Stage One 504 and by CAM Stage Zero 502. Accordingly, if transistor 516a is turned on, and if any of CAM cells 303a–d discharges match line 510a, then the output of inverter 512a is a logic one state so that transistor 514a is turned on (because the output of inverter 512a is connected to the gate of transistor 514a). If both transistors 514a and 516a are turned on, then circuitry 500 discharges match line MATCH_OUT0.

Accordingly, transistor 516a selectively enables CAM Stage Zero 502. For a "compare" operation involving information stored in CAM cells 302a–d (but not CAM cells 303a–d), processor 10 clears EN0A to a logic zero state. By comparison, for a "compare" operation involving information stored in CAM cells 302a–d and 303a–d, processor 10 sets EN0A to a logic one state; moreover, by selectively setting EN0A to a logic one state at a suitable moment, processor 10 is able to coordinate the timing of "compare" operations to be different between CAM Stage Zero 502 and CAM Stage One 504.

In the examples of FIGS. 4a–b, a CAM cell includes a RAM cell together with dynamic comparator circuitry. The dynamic comparator circuitry is clocked, either by using a clocked enable signal (e.g. CAM_EN in FIG. 4a) or by clocking the delivery of information to bit lines (e.g. bit lines 310a–b in FIG. 4b). Since the dynamic comparator circuitry is clocked, the interface (e.g. inverter 512a and transistor 514a) between cascadably connected CAM stages (e.g. CAM Stage Zero 502 and CAM Stage One 504) does not need to be clocked. In this manner, the interlace between the cascadably connected CAM stages is advantageously streamlined.

Figure 6:
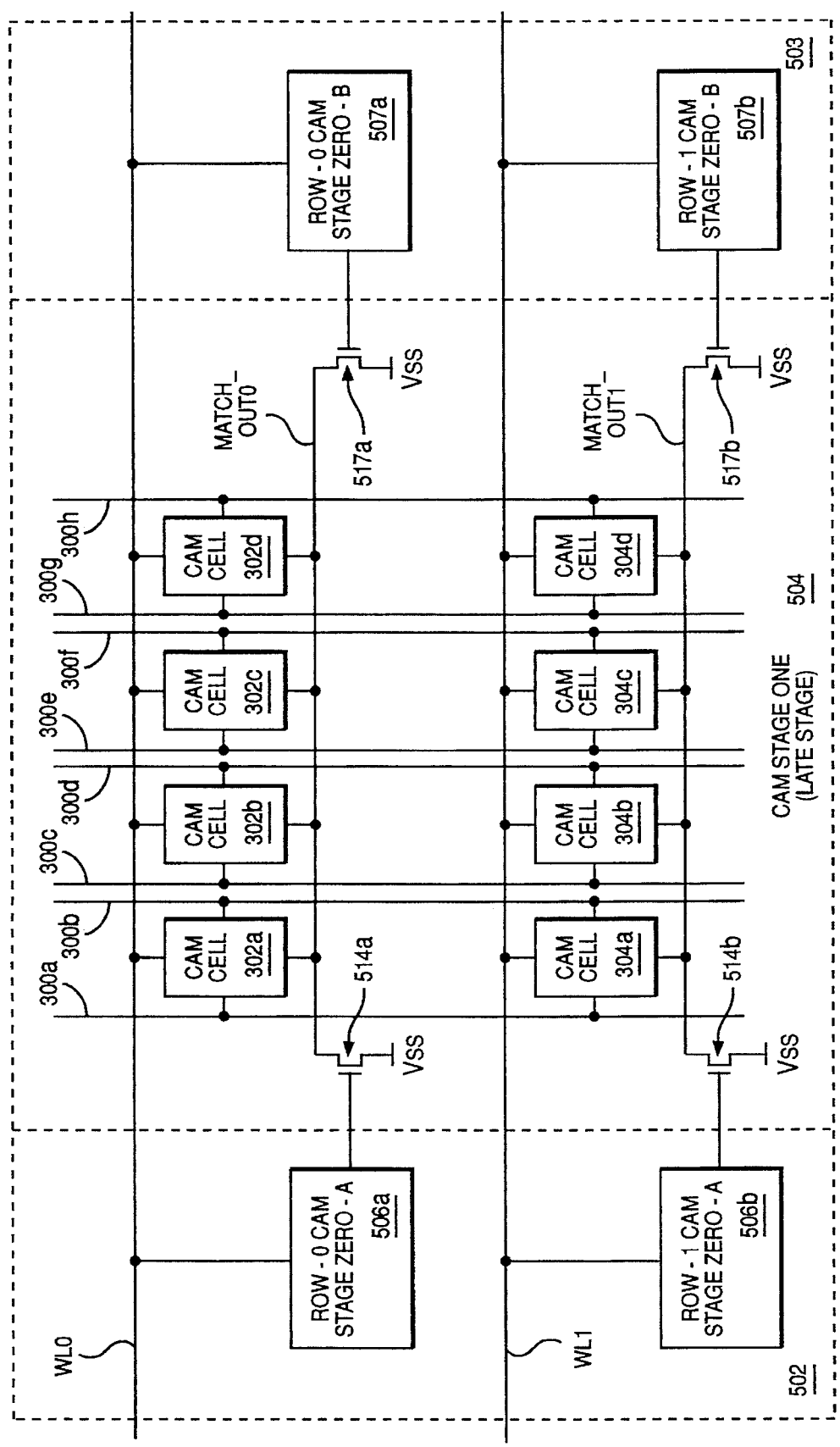
FIG. 6 is a schematic electrical circuit diagram of a second illustrative embodiment of cascadable CAM circuitry.

FIG. 6 is a schematic electrical circuit diagram of a second illustrative embodiment of cascadable CAM circuitry 500. More particularly, FIG. 6 shows cascadable CAM circuitry 500 with parallel stages. In FIG. 6, Row-0 of CAM circuitry 500 includes identical parallel stages Row-0 CAM Stage Zero-A 506a and Row-0 CAM Stage Zero-B 507a. Also, Row-0 of CAM circuitry 500 includes a subsequent stage Row-0 CAM Stage One including CAM cells 302a–d and pulldown n-channel field effect transistors 514a and 517a. Transistor 517a operates relative to CAM Stage 507a in the same manner as transistor 514a operates relative to CAM Stage 506a.

Further, in FIG. 6, Row-1 of CAM circuitry 500 includes identical parallel stages Row-1 CAM Stage Zero-A 506b and Row-1 CAM Stage Zero-B 507b. Also, Row-1 of CAM circuitry 500 includes a subsequent stage Row-1 CAM Stage One including CAM cells 304a–d and pulldown n-channel field effect transistors 514b and 517b. Transistor 517b operates relative to CAM Stage 507b in the same manner as transistor 514b operates relative to CAM Stage 506b.

For clarity, FIG. 6 does not show bit lines 301a–h or analogous bit lines connected to CAM stages 507a–b; nevertheless, such analogous bit lines are included in the second illustrative embodiment (FIG. 6) of CAM circuitry 500. The second illustrative embodiment (FIG. 6) of CAM circuitry 500 does not include optional transistors 516a–b or analogous pulldown n-channel field effect transistors which optionally could be included in CAM circuitry 500 as "enable" devices for CAM stages 507a–b. Such optional "enable" devices are discussed further hereinabove in connection with FIG. 5.

According to the second illustrative embodiment (FIG. 6) of CAM circuitry 500, the subsequent CAM Stage One 504 of CAM circuitry 500 inputs signals from multiple previous stages 502 and 503 in parallel. Accordingly, any of transistors 514a and 517a is operable to discharge MATCH_OUT0 independently of one another. In this manner, a three-or-more-stage cascadable CAM (such as the second illustrative embodiment of CAM circuitry 500 shown in FIG. 6) achieves the speed of a two-stage cascadable CAM (such as the first illustrative embodiment of CAM circuitry 500 shown in FIG. 5).

The second illustrative embodiment of CAM circuitry 500 shown in FIG. 6 is particularly advantageous for large CAM circuitry, where parallel stages of CAM cells (e.g. CAM stages 502 and 503) are formed by left and right sides, respectively, of an array of CAM cells; the parallel stages directly output respective signals (e.g. to transistors 514a and 517a, respectively) into a final center stage (e.g. CAM stage 504). In this manner, semiconductor area is advantageously decreased because routing of match lines is decreased; all match lines can be routed co-linearly through a single horizontal channel of the semiconductor without forming lengthwise adjacent match lines. This technique of the second illustrative embodiment further reduces RC delays of CAM circuitry 500.

Notably, MATCH_OUT0 is further connectable to yet an additional subsequent CAM stage (not shown but identical in logical design to cascadable CAM Stage 506a) through the input transistor (not shown but identical in logical design to transistor 514a) of such a subsequent CAM stage. In that manner, the techniques of the first (FIG. 5) and second (FIG. 6) illustrative embodiments of CAM circuitry 500 are combined, such that CAM stages 506a and 507a of FIG. 6 output their respective match line signals in a parallel fashion to center CAM stage 504 of FIG. 6, while center CAM stage 504 further outputs its match line signal in a sequential fashion to the additional subsequent CAM stage.

FIG. 7 is a schematic electrical circuit diagram of prior art dynamic comparator circuitry, indicated generally at 700. Comparator circuitry 700 includes a row of XOR cells 702-d, 704a–d, and additional XOR cells which are not shown in FIG. 7 for clarity. As shown in FIG. 7, comparator circuitry 700 is able to compare bits A0–A7 against bits B0–B7, respectively. Together, bits A0–A7 form a byte A, and bits B0–B7 form a byte B.

Accordingly, comparator circuitry 700 is able to compare a first byte A against a second byte B. Together bytes A and B form a byte pair. Likewise, comparator circuitry 700 can include additional rows for comparing additional byte pairs.

As shown in FIG. 7, either dynamic XOR cells or static XOR cells, or both, can be used for comparator circuitry 700. Outputs of dynamic XOR cells 702a–d are respectively connected to gates of pulldown n-channel field effect transistors 706a–d. Outputs of static XOR cells 704a–d are respectively connected to gates of pulldown n-channel field effect transistors 708a–d.

Sources of transistors 706a–d are connected to voltage reference node Vss. Drains of transistors 706a–d are connected to match line MATCH of FIG. 7. Moreover, a clock signal CLK is connected to gates of pulldown n-channel field effect transistors 710a–d.

Sources of transistors 710a–d are connected to voltage reference node Vss. Drains of transistors 710a–d are respectively connected to sources of transistors 708a–d. Drains of transistors 708a–d are connected to match line MATCH of FIG. 7.

Dynamic XOR cell 702a is a representative one of dynamic XOR cells 702a–d. Dynamic XOR cell 702a compares bit A0 against bit B0. If A0=B0 (i.e. bits A0 and B0 each have a logic one state, or bits A0 and B0 each have a logic zero state), then transistor 706a is turned off; otherwise, transistor 706a is turned on. If transistor 706a is turned off, then match line MATCH of FIG. 7 remains charged to a logic one state; by comparison, if transistor 706a is turned on, then match line MATCH of FIG. 7 discharges to a logic zero state.

Static XOR cell 704a is a representative one of static XOR cells 704a–d. Static XOR cell 704a compares bit A4 against bit B4. If A4=B4 (i.e. bits A4 and B4 each have a logic one state, or bits A4 and B4 each have a logic zero state), then transistor 708a is turned off; otherwise, transistor 708a is turned on. If transistor 708a is turned off, then match line MATCH of FIG. 7 remains charged to a logic one state; by comparison, if transistor 708a is turned on, then match line MATCH of FIG. 7 discharges to a logic zero state in response to clock signal CLK having a logic one state.

This responsiveness to clock signal CLK is important in connection with static XOR cells 704a–d, because the discharging of match line MATCH of FIG. 7 would not otherwise be timed relative to the precharging of match line MATCH of FIG. 7. This is because the outputs of static XOR cells 704a–d are not timed relative to the precharging of match line MATCH of FIG. 7. By comparison, the outputs of dynamic XOR cells 702a–d are timed relative to the precharging of match line MATCH of FIG. 7, because XOR cells 702a–d are dynamic; accordingly, clock signal CLK is not used in connection with dynamic XOR cells 702a–d.

In operation, match line MATCH of FIG. 7 is precharged to a logic one state by clearing PRECHARGE to a logic zero state. More particularly, by clearing PRECHARGE to a logic zero state, a p-channel field effect transistor 712 is turned on. This results in precharging of match line MATCH of FIG. 7, because a gate of transistor 712 is connected to PRECHARGE, a source of transistor 712 is connected to a voltage supply node Vdd, and a drain of transistor 712 is connected to match line MATCH of FIG. 7.

After precharging match line MATCH of FIG. 7, if A0=B0, A1=B1, A2=B2, A3=B3, A4=B4, A5=B5, A6=B6 and A7=B7, then match line MATCH of FIG. 7 remains charged to a logic one state; otherwise, match line MATCH of FIG. 7 discharges to a logic zero state at a suitable moment after the precharging of match line MATCH of FIG. 7.

FIG. 8 is a schematic electrical circuit diagram of a first illustrative embodiment of cascadable dynamic comparator circuitry, indicated generally at 800. In the illustrative embodiment of FIG. 2 discussed further hereinabove, TLB 102 (FIG. 2) is a fully associative TLB including CAM circuitry 500 of FIG. 5. In an alternative embodiment of FIG. 2, TLB 102 (FIG. 2) is a set associative TLB including comparator circuitry 800 of FIG. 8.

According to such an alternative embodiment, TLB 102 selects multiple 20-bit RPNs (and tags respectively associated with these selected 20-bit RPNs) in response to a first portion (e.g. the least significant four bits) of the 40-bit VSID/Page Index. For example, if TLB 102 is a 2-way set associative TLB, then TLB 102 selects two RPNs (and their respectively associated tags) in response to the first portion of the VSID/Page Index.

In this alternative embodiment, TLB 102 uses comparator circuitry 800 to further select one of the selected 20-bit RPNs in response to a second portion (e.g. the most significant 36 bits) of the 40-bit VSID/Page Index. This second portion includes any portion of the VSID/Page Index which is not part of the first portion. More particularly, comparator circuitry 800 compares the second portion against the tags respectively associated with the selected 20-bit RPNs.

According to one example, a 2-way set associative TLB 102 selects two 20-bit RPNs (and two 36-bit tags respectively associated with these selected 20-bit RPNs) in response to the least significant four bits of the 40-bit VSID/Page Index. Comparator circuitry 800 compares each of the 36-bit tags against the most significant 36 bits of the 40-bit VSID/Page Index. If TLB 102 included comparator circuitry 700 (FIG. 7) instead of comparator circuitry 800, XOR cells 702a–d would compare bits $2^{16}$ through $2^{19}$ of the 40-bit VSID/Page Index against bits $2^{12}$ through $2^{15}$ of a predetermined one of the 36-bit tags. Further, with comparator circuitry 700, XOR cells 704a–d would compare bits $2^{12}$ through $2^{15}$ of the 40-bit VSID/Page Index against bits $2^{8}$ through $2^{11}$ of the predetermined 36-bit tag.

In contrast, by TLB 102 including comparator circuitry 800 instead of comparator circuitry 700, XOR cells 702a–d compare bits $2^{4}$ through $2^{7}$ (part of the Page Index portion) of the 40-bit VSID/Page Index against bits $2^{0}$ through $2^{3}$ of the predetermined 36-bit tag. Further, with comparator circuitry 800, XOR cells 704a–d compare bits $2^{36}$ through $2^{39}$ (part of the VSID portion) of the 40-bit VSID/Page Index against bits $2^{32}$ through $2^{35}$ of the predetermined 36-bit tag.

As discussed further hereinabove in connection with FIG. 2, since time is used for translating the EA's Segment Index into its associated VSID through Segment Registers 100, TLB 102 inputs the Page Index portion (directly from the EA) earlier than the VSID portion (from Segment Registers 100). Notably, the Page Index portion (which is available earlier than the VSID portion) is a less significant portion of the 40-bit VSID/Page Index than is the VSID portion.

In FIG. 7, each of XOR cells 702a–d and 704a–d contributes additional diffusion loading to their shared connected match line MATCH, resulting from each XOR cell's associated pulldown transistor(s) (e.g. field effect transistors 706a–d, 708a–d and 710a–d) coupled to MATCH0. Accordingly, as more XOR cells are connected to match line MATCH, the match line's diffusion loading and RC (resistance-capacitance) delay are increased.

Comparator circuitry, 800 is improved over comparator circuitry 700. By including comparator circuitry 800 instead of comparator circuitry 700, a set associative TLB more quickly translates an EA into its associated RA.

Comparator circuitry 800 includes two identical cascadable stages, namely Compare Stage Zero (indicated by dashed enclosure 802) and Compare Stage One (indicated by dashed enclosure 804). More particularly, Compare Stage Zero 802 includes XOR cells 702a–d. Compare Stage One 804 includes XOR cells 704a–d.

Although only two cascadable stages (i.e. Compare Stage Zero 802 and Compare Stage One 804) are shown in FIG. 8, any number of additional stages can be included in circuitry 800. Each stage (except the last stage) is connected directly into a subsequent stage in the manner shown in FIG. 8, where Compare Stage Zero 802 is connected directly into subsequent stage Compare Stage One 804. In this manner, large comparator circuitry is physically organized into a sequence of smaller cascadable stages, with each stage having its own respective match line (and its own respective circuitry for precharging such match line).

For example, as shown in FIG. 8, Compare Stage Zero 802 has a respective match line 810, and Compare Stage One 804 has a respective match line MATCH_OUT. Advantageously, each of match line 810 and MATCH_OUT has less diffusion loading and less RC delay than MATCH of FIG. 7. This is because each of match line 810 and MATCH_OUT is shorter (and has fewer connected XOR cells) than MATCH of FIG. 7, and the diffusion loading of match line 810 is electrically isolated from the diffusion loading of MATCH_OUT by an inverter 812 and a pulldown n-channel field effect transistor 814.

Accordingly, the diffusion loading and RC delay on MATCH_OUT is reduced in comparison to the diffusion loading and RC delay on MATCH of FIG. 7. The reduced diffusion loading and reduced RC delay enables each of Compare Stage Zero 802 and Compare Stage One 804 to achieve faster output edge rates than comparator circuitry 700 (FIG. 7), thereby speeding and improving the drive time of each of match lines 810 and MATCH_OUT relative to MATCH of FIG. 7.

Moreover, in comparator circuitry 800, pulldown transistors (e.g. field effect transistors 706a–d, 708a–d and 710a–d) are smaller without sacrificing speed, thereby achieving smaller layout area within integrated circuitry.

Individually, each of Compare Stage Zero 802 and Compare Stage One 804 has less diffusion loading and less RC delay and is therefore faster than circuitry 700 (FIG. 7). For a "compare" operation, if comparator circuitry 800 inputs a first portion of the to-be-compared information earlier than a second portion of the to-be-compared information, then comparator circuitry 800 performs the "compare" operation significantly faster than comparator circuitry 700. If comparator circuitry 800 inputs all of the to-be-compared information at substantially the same moment, then the significance of such improvement in speed is diminished.

Nevertheless, in the example discussed further hereinabove in connection with FIG. 2, since time is used for translating the EA's Segment Index into its associated VSID through Segment Registers 100, TLB 102 inputs the least significant Page Index portion (directly from the EA) earlier than the more significant VSID portion (from Segment Registers 100).

By a set associative TLB 102 including comparator circuitry 800 instead of comparator circuitry 700, XOR cells 702a–d compare bits $2^4$ through $2^7$ (part of the Page Index portion) of the 40-bit VSID/Page Index against bits $2^0$ through $2^3$ of the predetermined 36-bit tag. Further, with comparator circuitry 800, XOR cells 704a–d compare bits $2^{36}$ through $2^{39}$ (part of the VSID portion) of the 40-bit VSID/Page Index against bits $2^{32}$ through $2^{35}$ of the predetermined 36-bit tag. Thus, sequential XOR cells 702d and 704a input non-sequential bits $2^4$ and $2^{39}$, respectively, of the 40-bit VSID/Page Index.

Notably, XOR cells 702a–d are in Compare Stage Zero 802. Further, XOR cells 704a–d are in Compare Stage One 804. Accordingly, in terms of the bit significance order within the VA's 40-bit VSID/Page Index, the set of bits $2^{36}$ through $2^{39}$ of the 40-bit VSID/Page Index are input by comparator circuitry 800 out of order relative to the set of bits $2^4$ through $2^7$ of the 40-bit VSID/Page Index.

However, in terms of the time order in which TLB 102 inputs the VA's 40-bit VSID/Page Index, the set of bits $2^{36}$ through $2^{39}$ are input by comparator circuitry 800 in order relative to the set of bits $2^4$ through $2^7$. This is because the set of bits $2^4$ through $2^7$ (part of the less significant Page Index portion input by comparator circuitry 800 directly from the EA) are input by comparator circuitry 800 earlier than the set of bits $2^{36}$ through $2^{39}$ (part of the more significant VSID portion input by comparator circuitry 800 from Segment Registers 100).

Accordingly, by XOR cells 702a–d inputting bits $2^4$ through $2^7$, and by XOR cells 704a–d inputting bits $2^{36}$ through $2^{39}$, Compare Stage Zero 802 is the early non-critical stage, and Compare Stage One 804 is the late critical stage. Thus, according to the cascadable comparator-based TLB technique of this example, the early non-critical stage is more electrically isolated from the late critical stage when compared to conventional techniques.

Since information arrives at the early non-critical stage before the late critical stage, the isolation of diffusion loading and the smaller RC delay of comparator circuitry 800 allows the late critical Compare Stage One 804 (FIG. 8) to have a significantly faster response time than comparator circuitry 700 (FIG. 7). This response time is measured from the arrival of all bits A0–A7 and B0–B7 until validity of the signal on the match line; the match line is MATCH_OUT for Compare Stage One 804 and is MATCH for comparator circuitry 700.

With the improved technique of FIG. 8, it is estimated that the match line (MATCH_OUT) loading of the critical stage (Compare Stage One 804) is reduced substantially relative to the conventional technique of FIG. 7. Accordingly, in Compare Stage One 804 of FIG. 8, pulldown transistors (e.g. field effect transistors 706a–d, 708a–d and 710a–d) operate substantially faster than in FIG. 7. Alternatively, if silicon layout area is a more critical factor than speed, pulldown transistors can be advantageously smaller than in FIG. 7.

Further, it is estimated that the match line (810) loading of the non-critical stage (Compare Stage Zero 802) is reduced substantially relative to the conventional technique of FIG. 7. All this is at least partly attributable to the fact that, in the example of FIG. 8, the single common match line MATCH (FIG. 7) is replaced by multiple match lines 810 and MATCH_OUT (FIG. 8) each having less diffusion loading mid RC delay than MATCH (FIG. 7).

Accordingly, the cascadable comparator-based TLB of the example of FIG. 8 is both faster and smaller than a conventional comparator-based TLB. If a portion of the TLB compare data arrives earlier than another portion of the TLB compare data, the technique of FIG. 8 is significantly faster than a conventional comparator-based TLB technique.

A source of an n-channel field effect transistor 816 is connected to a voltage reference node Vss. A drain of transistor 816 is connected to a source of n-channel field effect transistor 814. A drain of transistor 814 is connected to MATCH_OUT.

Referring to FIG. 8, in operation, transistor 816 (in Compare Stage One 804) operates as an "enable" device for Compare Stage Zero 806. If ENABLE (connected to the gate of transistor 816) is a logic one state, then transistor 816 is turned on; otherwise, transistor 816 is turned off. If transistor 816 is turned off, then preceding Compare Stage Zero 802 is "disabled", such that match line MATCH_OUT is controlled solely by Compare Stage One 804 without regard to Compare Stage Zero 802 or to the state of match line 810. In that situation, any of XOR cells 704a–d is able to discharge match line MATCH_OUT.

By comparison, if transistor 816 is turned on, then preceding Compare Stage Zero 802 is "enabled", such that match line MATCH_OUT is controlled by Compare Stage One 804 and by Compare Stage Zero 802. Accordingly, if transistor 816 is turned on, and if any of XOR cells 702a–d discharges match line 810, then the output of inverter 812 is a logic one state so that transistor 814 is turned on (because the output of inverter 812 is connected to the gate of transistor 814). If both transistors 814 and 816 are turned on, then circuitry 800 discharges match line MATCH_OUT.

Accordingly, transistor 816 selectively enables Compare Stage Zero 802. For a "compare" operation involving information input by XOR cells 704a–d (but not XOR cells 702a–d), processor 10 clears ENABLE to a logic zero state. By comparison, for a "compare" operation involving information input by XOR cells 702a–d and 704a–d, processor 10 sets ENABLE to a logic one state; moreover, by selectively setting ENABLE to a logic one state at a suitable moment, processor 10 is able to coordinate the timing of "compare" operations to be different between Compare Stage Zero 802 and Compare Stage One 804.

Since the XOR cells are either dynamic (and accordingly clocked) or static (and accordingly operated in combination with clock signal CLK as shown in FIG. 8), the interface (e.g. inverter 812 and transistor 814) between cascadably connected compare stages (e.g. Compare Stage Zero 802 and Compare Stage One 804) does not need to be clocked. In this manner the interface between the cascadably connected compare stages is advantageously streamlined.

Notably, XOR cells 702a–d are dynamic, and XOR cells 704a–d are static. Nevertheless, in an alternative embodiment of comparator circuitry 800, all XOR cells are dynamic and connected to their associated match lines in the same manner as XOR cells 702a–d are connected to match line 810. In yet another alternative embodiment of comparator circuitry 800, all XOR cells are static and connected to their associated match lines in the same manner as XOR cells 704a–d are connected to match line MATCH_OUT.

FIG. 9 is a schematic electrical circuit diagram of a second illustrative embodiment of cascadable dynamic comparator circuitry 800. More particularly, FIG. 9 shows cascadable comparator circuitry 800 with parallel stages. In FIG. 9, comparator circuitry 800 includes identical parallel stages Compare Stage Zero-A 802 (identical to Compare Stage Zero 802 of FIG. 8) and Compare Stage Zero-B 803 (identical in logical design to Compare Stage Zero 802 of FIG. 8). Also, comparator circuitry 800 includes a subsequent stage Compare Stage One 804 including XOR cells 704a–d and pulldown n-channel field effect transistors 814 and 817. Transistor 817 operates relative to Compare Stage 803 in the same manner as transistor 814 operates relative to Compare Stage 802.

The second illustrative embodiment (FIG. 9) of comparator circuitry 800 does not include optional transistor 816 or an analogous pulldown n-channel field effect transistor which optionally could be included in comparator circuitry 800 as an "enable" device for Compare Stage 803. Such optional "enable" devices are discussed further hereinabove in connection with FIG. 8.

According to the second illustrative embodiment (FIG. 9) of comparator circuitry 800, the subsequent Compare Stage One 804 of comparator circuitry 800 inputs signals from multiple previous stages 802 and 803 in parallel. Accordingly, any of transistors 814 and 817 is operable to discharge MATCH_OUT independently of one another. In this manner, a three-or-more-stage cascadable comparator (such as the second illustrative embodiment of comparator circuitry 800 shown in FIG. 9) achieves the speed of a two-stage cascadable comparator (such as the first illustrative embodiment of comparator circuitry 800 shown in FIG. 8).

The second illustrative embodiment of comparator circuitry 800 shown in FIG. 9 is particularly advantageous for large comparator circuitry, where parallel stages of XOR cells (e.g. Compare Stages 802 and 803) are formed by left and right sides, respectively, of an array of XOR cells; the parallel stages directly output respective signals (e.g. to transistors 814 and 817, respectively) into a final center stage (e.g. Compare Stage 804). In this manner, semiconductor area is advantageously decreased because routing of match lines is decreased; all match lines can be routed co-linearly through a single horizontal channel of the semiconductor without forming lengthwise adjacent match lines. This technique of the second illustrative embodiment further reduces RC delays of comparator circuitry 800.

Notably, MATCH_OUT is further connectable to yet an additional subsequent Compare Stage (not shown but identical in logical design to cascadable Compare Stage 802) through the input transistor (not shown but identical in logical design to transistor 814) of such a subsequent Compare Stage. In that manner, the techniques of the first (FIG. 8) and second (FIG. 9) illustrative embodiments of comparator circuitry 800 are combined, such that Compare Stages 802 and 803 of FIG. 9 output their respective match line signals in a parallel fashion to center Compare Stage 804 of FIG. 9, while center Compare Stage 804 further outputs its match line signal in a sequential fashion to the additional subsequent Compare Stage.

Although an illustrative embodiment of the present inventions and their advantages have been described in detail hereinabove, it has been described as example and not as limitation. Various changes, substitutions and alterations can be made in the illustrative embodiment without departing from the breadth, scope and spirit of the present inventions. The breadth, scope and spirit of the present inventions should not be limited by the illustrative embodiment, but should be defined only in accordance with the following claims and equivalents thereof.

What is claimed is:

1. Content addressable memory circuitry, comprising:
   first circuitry for storing first information and selectively modifying a logic state of a first match line in response to a comparison between said first information and second information;
   second circuitry for storing third information and selectively modifying a logic state of a second match line in response to a comparison between said third information and fourth information; and
   third circuitry for selectively modifying said logic state of said second match line in response to said logic state of said first match line.

2. The circuitry of claim 1 and further comprising circuitry for selectively disabling said third circuitry.

3. The circuitry of claim 1 and further comprising fourth circuitry for storing fifth information and selectively modifying a logic state of a third match line in response to a comparison between said fifth information and sixth information.

4. The circuitry of claim 3 and further comprising fifth circuitry for selectively modifying said logic state of said second match line in response to said logic state of said third match line.

5. The circuitry of claim 4 and further comprising circuitry for selectively disabling said fifth circuitry.

6. The circuitry of claim 3 wherein said sixth information is available for said comparison before said fourth information.

7. The circuitry of claim 1 wherein said second information is available for said comparison before said fourth information.

8. The circuitry of claim 1 wherein said first and second circuitry are identical in design.

9. The circuitry of claim 8 wherein said first and second circuitry are cascadable.

10. The circuitry of claim 9 wherein said first and second circuitry are coupled together in a sequence.

11. The circuitry of claim 1 and further comprising circuitry for precharging said first and second match lines.

12. The circuitry of claim 11 wherein said first circuitry is operable to selectively modify said logic state of said first match line by selectively discharging said first match line, and wherein said second circuitry is operable to selectively modify said logic state of said second match line by selectively discharging said second match line.

13. The circuitry of claim 1 wherein said first circuitry comprises first content addressable memory circuitry.

14. The circuitry of claim 13 wherein said second circuitry comprises second content addressable memory circuitry.

15. A method of operating content addressable memory circuitry, comprising the steps of:
  storing first information;
  selectively modifying a logic state of a first match line in response to a comparison between said first information and second information;
  storing third information;
  selectively modifying a logic state of a second match line in response to a comparison between said third information and fourth information; and
  selectively modifying said logic state of said second match line in response to said logic state of said first match line.

16. The method of claim 15 and further comprising the steps of:
  storing fifth information; and
  selectively modifying a logic state of a third match line in response to a comparison between said fifth information and sixth information.

17. The method of claim 16 and further comprising the step of selectively modifying said logic state of said second match line in response to said logic state of said third match line.

18. The method of claim 16 wherein said sixth information is available for said comparison before said fourth information.

19. The method of claim 15 wherein said second information is available for said comparison before said fourth information.

20. The method of claim 15 and further comprising the step of precharging said first and second match lines.

21. The method of claim 20 wherein said step of selectively modifying said logic state of said first match line comprises the step of selectively discharging said first match line, and wherein said second circuitry is operable to selectively modify said logic state of said second match line by selectively discharging said second match line.

* * * * *